Aug. 17, 1965 W. J. DWYER 3,201,238

METHOD OF MAKING ODD SHAPED PRINTED CIRCUITS

Filed Aug. 29, 1958

INVENTOR.
WALTER J. DWYER
BY
Pearson + Pearson
ATTORNEYS 3,201,238

METHOD OF MAKING ODD SHAPED PRINTED CIRCUITS

Walter J. Dwyer, 17 Lee St., Nashua, N.H.
Filed Aug. 29, 1958, Ser. No. 758,159
1 Claim. (Cl. 96—36)

This invention relates to printed circuit negatives of odd shaped configuration and to a method for making such negatives.

In the electrical and electronic fields, printed circuits are much used, the circuit usually being formed in flat connecting lines of conductive ink, metal strips and the like on a flat insulated support such as a plastic panel. One method of making such printed circuits is to prepare a flat drawing of the circuit, then to photograph the drawing to secure a flat negative, then to develop a positive image of the circuit photographically on a flat insulated panel covered with metal foil and then to etch off all of the foil from the panel except the printed circuit. The same method can, of course, be used to make a design of closely spaced parallel conductive lines on a dielectric support to form a flat polarizing grid. I use the term "printed circuit" to describe any and all patterns of flat conductive lines on an insulated support whether for producing portions of an electric circuit, a grid or for various other similar purposes.

While flat printed circuits present few problems of identical manufacture in quantity with accuracy, the manufacture of odd shaped or multi-planar printed circuits presents many problems. If it is desired to make printed circuits having uniformly accurately spaced and dimensioned lines on three dimensional, multi-planar supports having a plurality of angularly disposed faces, it is not possible to simply photograph drawing thereof to secure a useful negative. At present the conventional method of making multi-planar printed circuit device is to make each device separately rather than to use a master negative for developing an identical image on each device. Thus each separate device must either be assembled by stringing metal wires, or bars, on the insulated support or by applying metallic paint thereto and arduously copying the printed circuit thereon by manual means.

As far as I am aware, there is no method for photographically producing an accurate negative of an odd shaped or multi-planar printed circuit capable of being used to develop reproductions of the circuit on similarly shaped insulated supports.

It is the object of this invention to provide such an odd shaped or multi-planar negative of a printed circuit which can be used to make any desired number of accurate reproductions of the circuit by photographic means.

Another object of the invention is to provide a method for making odd shaped or multi-planar negative of printed circuits, by other than camera or photographic means, the resulting negatives, however, being usable for photographic reproduction of the printed circuit.

A further object of the invention is to provide a non-camera method of making a negative of an odd shaped or multi-planar printed circuit and an improved method of photographically developing the image of the circuit on a correspondingly shaped insulated support.

Other objects and advantages of the invention will be apparent from the claim, the description of the drawing and from the drawing in which:

Figures 1, 2, 3, 4, 5, 6, 7:
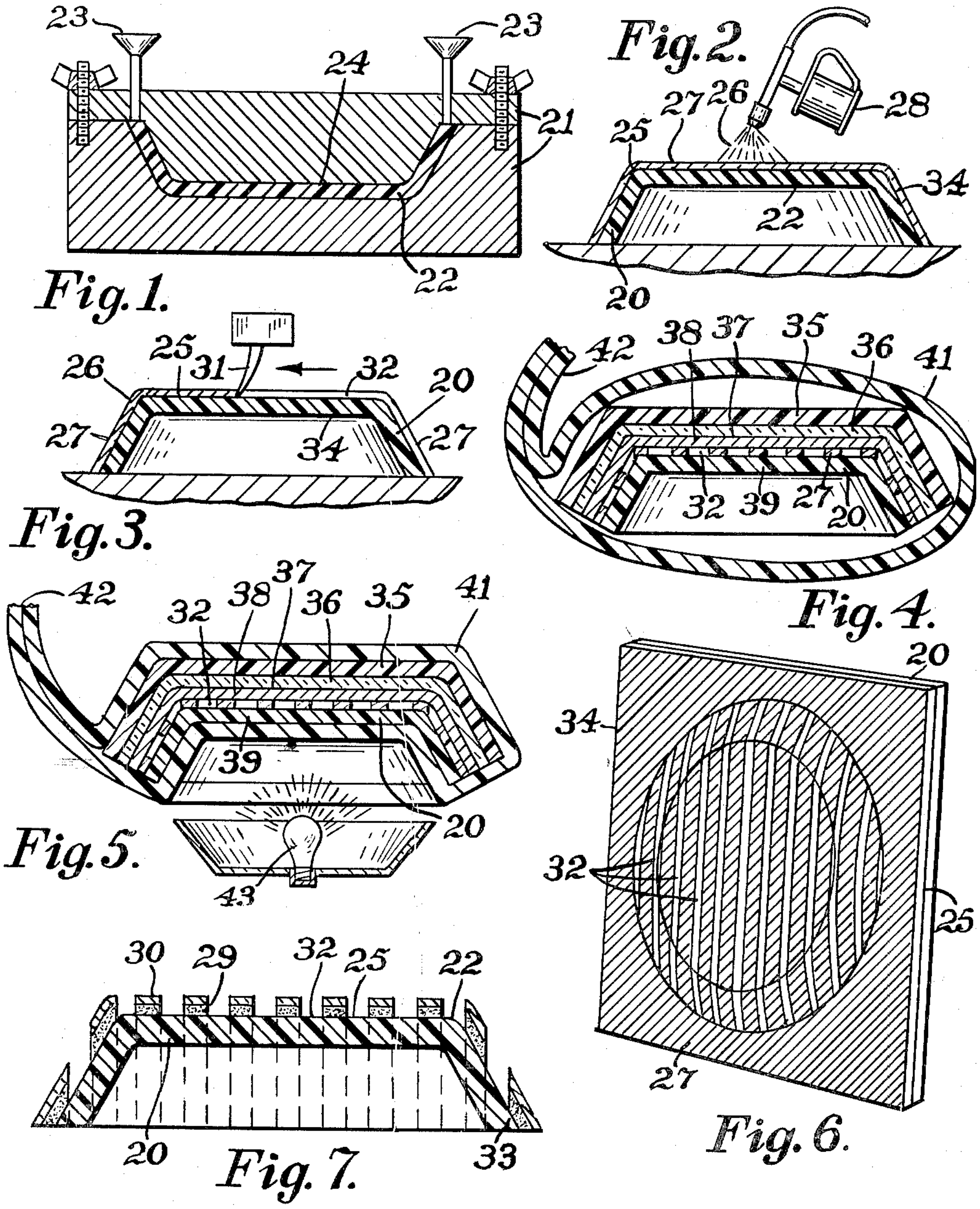
FIG. 1 is a diagrammatic view of the step of forming a transparent body of multi-planar shape.
FIG. 2 is a diagrammatic view of the step of covering the body with opaque material.
FIG. 3 is a diagrammatic view of the step of removing portions of the opaque layer in the design of the printed circuit.
FIG. 4 is a diagrammatic view of the step of clamping the resulting multi-planar shaped negative against the metal laminate of the desired product.
FIG. 5 is a diagrammatic view of the step of exposing the negative to light to create the image of the printed circuit in the resist coated laminate.
FIG. 6 is a view of a multi-planar printed circuit negative made in accordance with the invention for use in photographically forming a dished polarizing grid.
FIG. 7 is a sectional view of another multi-planar printed circuit negative made in accordance with the invention by an etching process.

A shown in FIG. 1 the first step of the method of this invention is the forming of a flexible, semi-flexible or rigid body 20 of moldable, clear, transparent material, and of odd, or multi-planar shape or configuration. Suitable materials for the making of the negative body 20 are resins such as epoxy, lucite, phenolic, melamine, etc., almost any kind of glass and almost any clear transparent plastic. A pattern of the body 20 may be made and set in a suitable mold 21, of a well known type. The pattern is then removed and the clear, transparent, liquid plastic 22 may be introduced as at 23 into the cavity 24, and allowed to set, to thereby form the body 20.

It will be understood that the above is merely an example of one form of molding and that the negative body 20 may also be formed by pressing a flowable, deformable, plastic sheet into the desired multi-planar form between the jaws of a press, by spraying viscous plastic on a suitable multi-planar form, and in other ways so long as the material is moldable or deformable and then settable into the desired permanent set, self supporting configuration.

Formation by molding in a mold is preferred for the reason that it provides greater accuracy in creating a negative body 20 of uniform thickness throughout the configuration thereof whether the desired body shape is of multi-planar generally parabolic, dished, cone or cup shape, cylindrical, cubical, triangular, pentagonal octagonal or of other non-spherical, non-flat shapes conforming to a similarly shaped printed circuit support. The particular multi-planar negative body 20 shown in the diagrammatic views FIG. 1 to FIG. 7 is of dished shape and usually less than one sixteenth of an inch ($\frac{1}{16}$) in thickness. It is substantially identical in shape with a polarizing grid used in one type of microwave antenna whereby it may form the body of a negative for photographically reproducing printed circuit grid lines on the dielectric support of such a polarizing grid.

The next step in the method of this invention is the covering of one face 25 of the transparent body 20 with an opaque material such as at 26. The covering coating 27 may be an opaque lacquer, or other paint, which may be sprayed as at 28 onto the face 25 of the body 20 or applied in any other well known manner for securing a coating, or film, of substantially uniform thickness when dried or set. The covering coating 27 may also be a thin dried film of metallic paint or a thin layer, or laminate, of metallic, or other opaque, foil 30. In the latter case (see FIG. 7) a suitable adhesive or binding layer 29 is provided for firmly bonding the metallic foil 30 to the face 25 of body 20. Any suitable adhesive, such as epoxy adhesive and any suitable foil such as copper or aluminum may be used for the purpose. I prefer to use a body 20 molded of "Lucite" and covered with a dried film of Sheffield black lacquer because the resulting negative is rugged, unlikely to crack or fracture and more easily clamped and handled in reproducing a large number of printed circuits.

The next step in the method of this invention is the removal of portions of the opaque covering coating 27 and/or the layer 29, in the design, or pattern, of the desired printed circuit until the entire circuit is outlined in the exposed face 25 of the transparent body 20. Where the coating 27 is a dried film of an opaque paint the removal step is performed with a stylus or engraver's tool 31 which scrapes or grinds off the paint along each line of the printed circuit down to the level of the face 25 of body 20. The openings, or incisions, 32 which form the transparent design of the desired printed circuit may also be accurately incised into the coating 27 by means of a milling machine, lathe or the like.

I find it convenient to perform the removal step with a variable height gauge of a commercially available type wherein a cutting tool, such as 31, is substituted for the usual scriber tool. The body 20 may be mounted vertically and the parallel cut lines made successively in accurate increments by means of the vernier scale adjusting mechanism of the gauge. The path of the cutting tool 31 conforms to the configuration of the body as it is drawn horizontally thereacross to produce the desired parallel, or other, openings such as 32 in each of the angularly disposed faces of the body.

As shown in FIG. 7 the formation of the openings 32 by incision with a cutting tool 31, or by an etching process, results in the walls of the openings 32 being planar, parallel and smooth rather than uneven and irregular, thereby increasing the accuracy of reproduction of the printed circuit lines.

The openings 32 may also be formed by etching in a well known manner, if desired. In such case, the covering coating 27 is an opaque film, or layer, 30 of metal, such as copper bonded to the body 20 by the adhesive layer 29 (FIG. 7). Strips of acid resistant film are applied to the layer 30 corresponding to the spaces between the openings 32 and the copper layer 30 is then subjected to the corrosive action of acid. The spaces between the lines are not eroded but the untreated lines 32 are eroded down to the level of the body 20 to create a multi-planar negative 33 with an opaque copper printed circuit pattern outlined transparently therein.

As shown in FIGS. 6 and 7 the metal lacquered type negative 33 and the lacquer layered type negative 34 are simulated photographic negatives, made in accordance with the method of the invention, and usable for photographically reproducing a plurality of accurate multi-planar printed circuits. They are characterized by the fact that the transparency of the negative is all in one plane and the opacity is all in another plane while in the ordinary camera-made negative the transparency and the opacity is all in the single plane of the light sensitive emulsion layer. The negatives 33 and 34 are formed of the transparent body 20 of uniform thickness and the opaque covering layer or coating 27, also of uniform thickness and firmly bonded to the body 20. The openings 32, outline the desired printed circuit in the transparent material 22 of body 20 whereby exposure to light will create the exact image of the circuit on a light sensitive face of a correspondingly shaped support.

It will be understood that the printed circuit, products, for which this invention is especially designed, are of the skin type and may be formed of a dished layer 36, of metal foil, such as copper, covered by glass cloth impregnated and bonded with epoxy resin to form an epoxy glass laminate. The epoxy glass laminate, or support, 35 with its copper layer 36 cannot be formed into a printed circuit by the use of the usual flat negative photographic reproduction means because of distortion.

As shown in FIG. 4, however, an epoxy glass laminate 35, with its layer of copper 36 can have a circuit printed thereon photographically by the use of the multi-planar negative such as 39 of this invention. The exposed face 37 of the metal layer 36 is coated with a film of etchant resistive material 38 such as light sensitive "Kodak Photo Resist". A negative 39, similar to negatives 33 or 34 and made in accordance with the invention to conform to the shape of support 35, is then tightly clamped against the support 35 as shown in FIG. 4. Preferably an intimate contact is secured by vacuum techniques, for example, by enclosing the parts in a transparent air tight bag 41 and exhausting the air therein through a pipe 42 to a vacuum pump not shown. The bag 41 may be of any suitable plastic material such as polyvinyl alcohol commercially available as "P.V.A." film of Reynolds Metals Company. Air is thus exhausted from between the layer 38 and the negative 39 and atmospheric pressure is enabled to tightly press the negative against the support 35.

As shown in FIG. 5 the remaining steps are essential to the completion of the desired odd shaped, or multi-planar printed circuit in quantity but are conventional. The negative 39 is exposed to light source 43, while sealed in the transparent bag 41, for a given exposure time to create an image of the printed circuit in the dry etchant resistive film 38. Upon separation of the negative 39 from the support 35, the support 35 is then developed in photo resist solvent of a well known type. The resistorized copper 36 which the light source contacted through the openings 32 in the clear, transparent body 20 of negative 39 remain coated with the resist. The parts of layer 36 which were covered by the opaque coating 27 of negative 39, and which held back the light, no longer are coated with the resist and therefore the copper is exposed to etching action.

Figure 8:
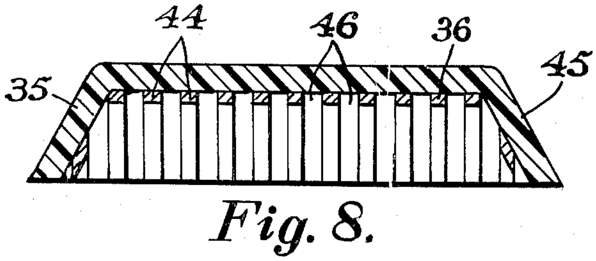
FIG. 8 is a sectional view of a typical printed circuit product, of multi-planar configuration, which can be photographically reproduced in quantity by the use of the negative and method of this invention.

The support 35 is then etched in a well known manner to etch away all of the copper layer 36 down to the level of the support 35 except the relief image of the printed circuit defined by thin copper lines 44. The printed circuit product 45 is shown in FIG. 8 with parallel copper lines 44 on the epoxy glass laminate 35, separated by the spaces 46.

I claim:

The method of successively reproducing printed circuits on odd shaped, metal covered supports of the type having a plurality of angularly disposed faces, which method comprises, first molding clear transparent plastic material on one said support to form a solidified, pre-shaped skin of uniform thickness having a plurality of angularly disposed faces exactly conforming to the corresponding faces of said support;

then separating said skin from said support and firmly bonding a covering coating of solid, opaque material on the said angularly disposed faces of said skin;

then removing portions of said opaque coating down to the level of said skin by forming smooth, parallel, planar walled openings to expose the desired printed circuit design in the transparent material thereof;

then coating the metal covering of one of said supports with a photographic resist, then nesting said skin into intimate contact with said resist covered support, enclosing the same in a flexible transparent bag, exhausting air therefrom to vaccum clamp said skin against said support without distortion and photographically printing the image of said printed circuit on the metal covering of said support;

then removing said skin and support from said bag, developing said image on said support, removing the resist coating from, and etching off all of the metal covering thereon except said image, and then repeating said steps to produce successive printed circuits from said skin as a negative.

(References on following page)

References Cited by the Examiner

UNITED STATES PATENTS

| | | | |
|---|---|---|---|
| 1,224,328 | 5/17 | Scritsmier | 41—46 |
| 2,204,147 | 6/40 | Murray | 94—46 |
| 2,321,249 | 6/43 | Rudnick | 96—85 |
| 2,435,889 | 2/48 | Kerridge | 96—36 |
| 2,491,386 | 12/49 | Miller et al. | 96—27 |
| 2,537,329 | 1/51 | Campbell | 96—27 |
| 2,801,919 | 8/56 | Eichorn | 96—27 |
| 2,942,972 | 6/60 | Charlton | 96—27 |
| 2,967,766 | 1/61 | Wetmore et al. | 96—35 |

OTHER REFERENCES

Eisler: "British Institution of Radio Engineers," vol. 13, No. 11, November 1953, pp. 523–524.

Clerc: "Ilford Manual of Process Work," Ilford Ltd., London, 5th edition, 1951, pages 120–121.

NORMAN G. TORCHIN, *Primary Examiner.*

MILTON STERMAN, PHILIP E. MANGAN, HAROLD N. BURSTEIN, ABRAHAM H. WINKELSTEIN, *Examiners.*